United States Patent [19]
Lin et al.

[11] Patent Number: 6,074,912
[45] Date of Patent: Jun. 13, 2000

[54] METHOD FOR FORMING DIFFERENT AREA VIAS OF DYNAMIC RANDOM ACCESS MEMORY

[75] Inventors: Kuen-Yow Lin, Chia-I; Kuo-Chi Lin, Lu-Chou, both of Taiwan

[73] Assignee: United Microelectronics Corp., Hsin-Chu, Taiwan

[21] Appl. No.: 09/245,891

[22] Filed: Feb. 8, 1999

[51] Int. Cl.[7] ............................................... H01L 21/8242
[52] U.S. Cl. ........................ 438/253; 438/637; 438/666
[58] Field of Search .................... 438/238–241, 438/253–256, 381, 396–399, 637–638, 666

[56] References Cited

U.S. PATENT DOCUMENTS

| | | | |
|---|---|---|---|
| 5,907,779 | 5/1999 | Choi | 438/279 |
| 6,010,953 | 5/1999 | Prall | 438/586 |

*Primary Examiner*—Jey Tsai
*Attorney, Agent, or Firm*—Bacon & Thomas, PLLC

[57] ABSTRACT

A method for forming different area vias of dynamic random access memory is disclosed. Essential points of the invention comprise spacer is only formed on gate of periphery circuit, and depth of passivation layer of periphery circuit gates is larger than depth of layer that capped over gates of cell. The provided method comprises following steps: First, capping a layer over gate of cell and gate of periphery circuit and then forming spacer on gate of periphery circuit, where depth of capping layer is smaller than depth of passivation layer of periphery circuit gate. Second, both gate of cell and gate of periphery circuit are cover by a dielectric layer. Third, vias in both cell and periphery circuit are formed simultaneously by photolithography and etching, where etching comprises etching of dielectric layer and etching of passivation layer. Advantageous of the invention is only a photolithography process is necessary and then throughput is enhanced.

20 Claims, 4 Drawing Sheets

METHOD FOR FORMING DIFFERENT AREA VIAS OF DYNAMIC RANDOM ACCESS MEMORY

BACKGROUND OF THE INVENTION

1. Field of the Invention

The present invention relates to a method for forming different area vias of dynamic random access memory and more particularly to a method that vias in a cell region and in a periphery circuit region are patterned and formed in a mask and in same etching process.

2. Description of the Prior Art

In contemporary semiconductor industry, semiconductor memory is a popular and important product for widely and effective application. In particular, dynamic random access memory (DRAM) is more broadly used in microelectronic product for high-integration of DRAM than other semiconductor memory.

There are both cell region and periphery circuit region in the DRAM, the cell region comprises metal oxide semiconductors (MOS) and capacitors, and is used to storage messages. In comparison, the periphery circuit region comprises gates and conductive lines, and is used to connect the cell region and related elements. Moreover, though both gates of the cell region and gates of the periphery circuit region can be formed simultaneously and only a mask is required to define locations of these gates. Nevertheless, many semiconductor structures are formed separated in these two regions and then required mask, photolithography and related fabrication are prepared and preformed in each individual region. Thus, the throughput of DRAM fabrication is restricted by duplicate process in two regions. Then an incidental disadvantageous is that consumed material also is increased by duplicate process in these two regions.

An obvious example is that vias in different regions can not be opened at the same time and two masks are necessary to pattern locations of vias. Conventional fabrication of vias comprises following steps: First, as shown in FIG. 1A, a plurality of cell gates are formed in the cell region and a plurality of periphery circuit gates are formed in the periphery circuit region, where these gates are formed on a substrate 10. Moreover, each gate of cell region comprises a conductive layer 12, a polycide layer 13 and a passivation layer 14. In comparison, each gate of periphery circuit region comprises a conductive layer 15, a polycide layer 16 and a passivation layer 17. Therewith a first dielectric layer 11 is formed over substrate 10 and covers all gates, and then a second dielectric layer 18 is formed over first dielectric layer 11. Subsequently, a plurality of spacers are formed in sidewalls of all gates.

Afterwards, a third dielectric layer 19 is formed over substrate 10 and covers gates of cell region and gates of periphery circuit region. Subsequently, vias in cell region are formed by photolithography method and etching process as FIG. 1B shows.

Afterwards, as shown in FIG. 1C, another dielectric layer 195 is formed over third dielectric layer 19 and fills vias in cell region. Then vias in periphery circuit region are formed by photolithography method and etching process.

Obviously, there are two mask are necessary in conventional fabrication of vias, and required photolithography and etching process also are double for duplicate fabrication in cell region and periphery circuit region.

For these foregoing reasons, it is obvious that throughput of DRAM fabrication is degraded by duplicate process, and then it is profitable and necessary to develop new fabrication that forming DRAM without duplicate process. In addition, it is more beneficial to form vias of cell region and vias of periphery circuit region at the same time, where an incidental advantageous that only a mask and a photolithography are necessary.

SUMMARY OF THE INVENTION

In accordance with the present invention, a method for forming different area vias of dynamic random access memory is provided. Furthermore, vias land on substrate of cell region and vias land on gates of periphery circuit region are patterned and opened in one mask and one etching process. Thus, throughput is enhanced by the invention. Besides, self-aligned contact process is used in the invention by covering conductive layers of cell gates with enough deep dielectric layer. Then required precision of photolithography is broadened and unexpected short between conductor vias and covering conductive layers of cell gates is protected.

According to an embodiment of the invention, a method for forming different area vias of dynamic random access memory is provided, said method comprises following steps. First, a plurality of cell gates are formed in a cell region and a plurality of periphery circuit gates are formed in a periphery circuit region. Where each gate is formed on a substrate and comprises a conductive layer, a polycide layer and a passivation layer in sequence. Second, a first dielectric layer is formed over the substrate and covering these cell gates and these periphery circuit gates, and then a second dielectric layer is formed over the first dielectric layer. Third, a plurality of spacers are formed in sidewalls of said periphery circuit gates, and then a third dielectric layer is formed over the substrate and covers these cell gates and these periphery circuit gate. Fourth, a photoresist layer is formed over the third dielectric layer, where the photoresist layer is used to define these vias regions in both cell region and periphery circuit region. Fifth, part of the third dielectric layer is etched, where part of the third dielectric layer is uncovered by the photoresist layer. Afterwards, part of the first dielectric layer and part of the passivation layer of periphery circuit gates are etched, where these etched parts are uncovered by the photoresist layer. Finally, removing excess photoresist layer and then these vias are formed.

According to another embodiment of the invention, a method for forming a plurality of polysilicon vias land on different areas for high density dynamic random access memory is provided. The method comprises following steps: First, a doped polysilicon layer, a WSi layer and a first SiN layer are formed over a substrate in sequence. Afterwards, the photolithography process and the etching process are used to form a plurality of cell gates in the cell region and a plurality of periphery circuit gates in the periphery circuit region. Second, a first oxide layer is formed over the substrate and covers these cell gates and these periphery circuit gates. Then a second SiN layer is formed over the first oxide layer. Third, a plurality of SiN spacers are formed in sidewalls of these periphery circuit gates, where cell gates are still covered by the first oxide layer. Fourth, a second oxide layer is formed over the substrate and covers these cell gates and these periphery circuit gates. Then a photoresist layer is formed on the second oxide layer, where the photoresist layer is used to define these vias regions in both the cell region and the periphery circuit region. Fifth, part of the second oxide layer and part of the second SiN layer and part of the first SiN layer of periphery circuit cell are etched in sequence. Where part of second oxide layer, part of second SiN layer and part of first SiN layer are uncovered by photoresist layer. Finally, removing excess said photoresist layer and then vias are formed and land on both said cell regions and said periphery circuit region. Then polysilicon is filled in vias and polysilicon vias are formed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In accordance with the present invention, a method for forming different area vias of dynamic random access memory is provided. In the invention, vias land on substrate in cell region and vias land on gates in periphery circuit region are patterned by the same mask and then formed by conventional etching process. Thus, requirement of photolithography is economic and then throughput of fabrication is enhanced by the invention. Besides, self-aligned contact process is used to broaden protect required precision of photolithography and protect unexpected short between conductor vias and covering conductive layers of cell gates.

Figure 1A:
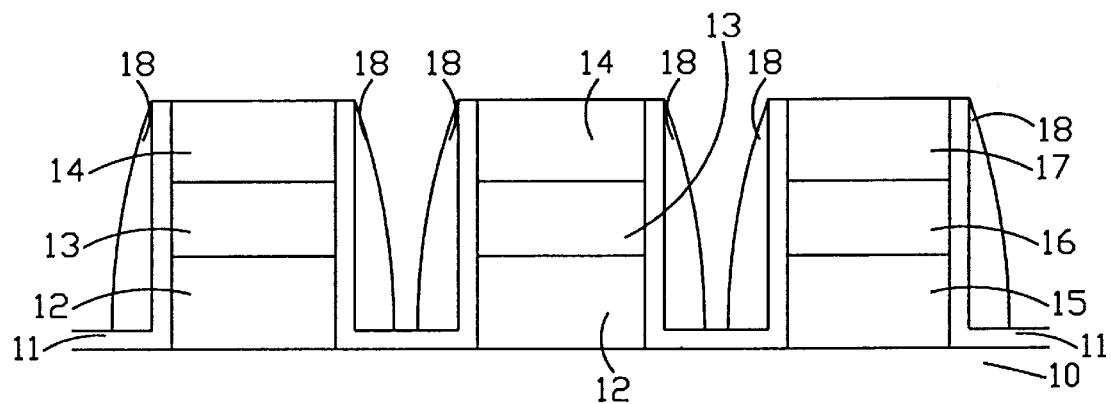
FIG. 1A to FIG. 1C show cross sectional views illustrative of conventional fabrication of vias in both cell region and periphery circuit region of dynamic random access memory.
Figure 1B:
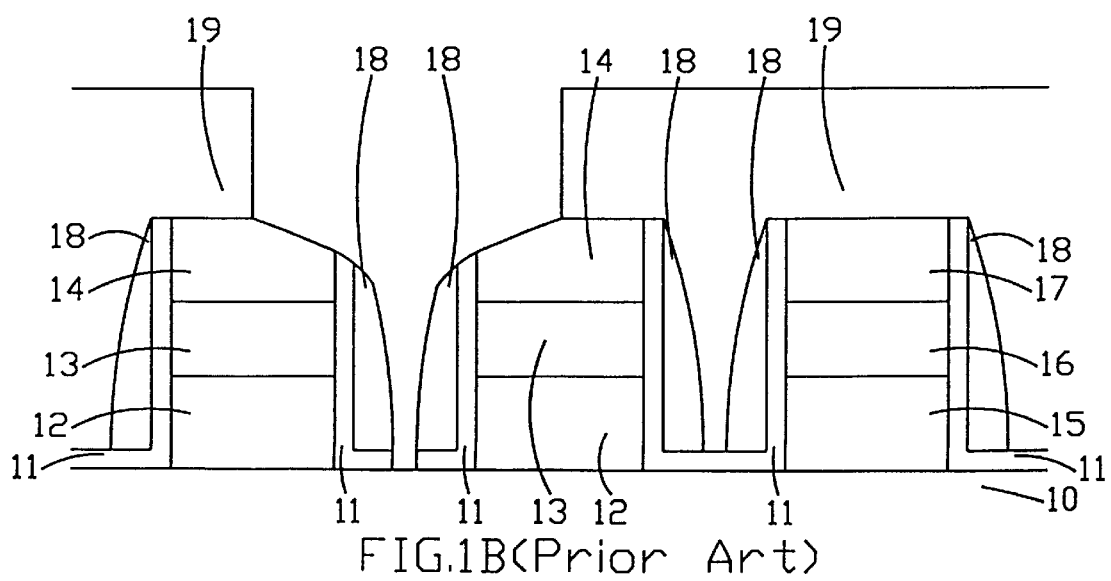
Figure 1C:
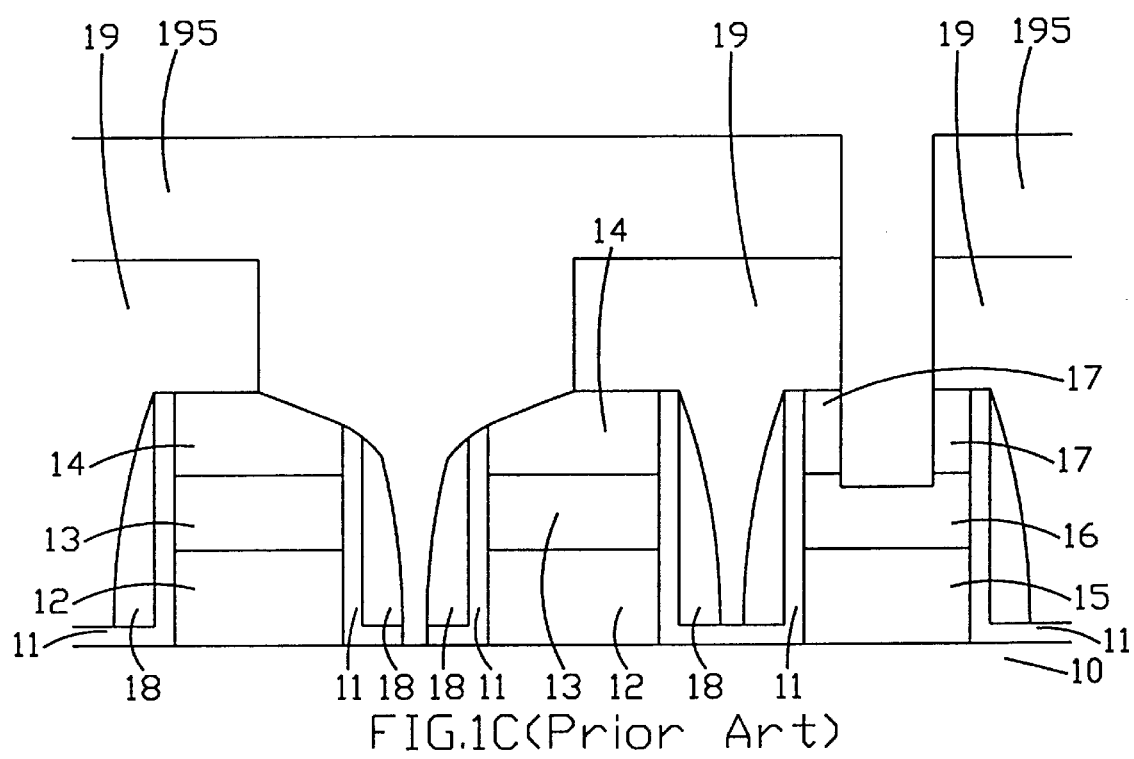
Figure 2A:
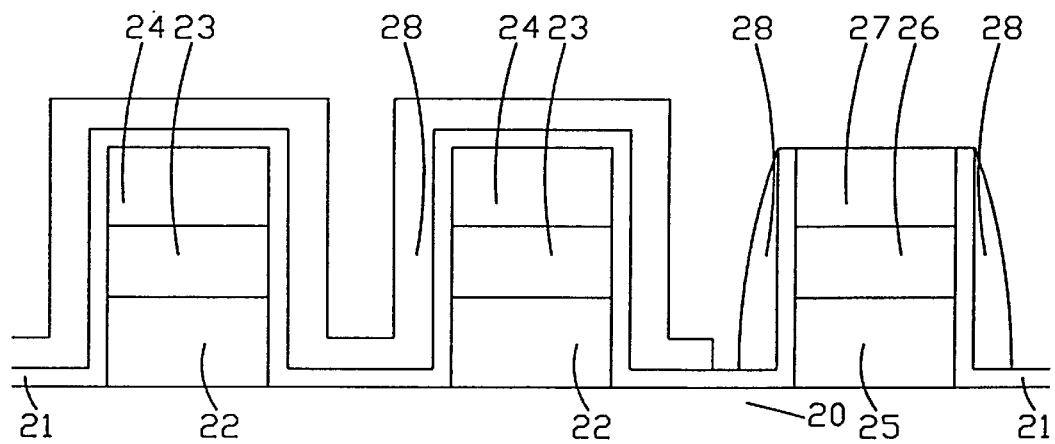
FIG. 2A to FIG. 2C show cross-sectional views illustrative of fabrication of vias in both cell region and periphery circuit region of dynamic random access memory according to one embodiment of provided invention.

According to first embodiment of the invention, a method is provided to form different area vias of dynamic random access memory. The provided method comprises following steps. First, as shown in FIG. 2A, a plurality of cell gates and a plurality of periphery circuit gates are formed on substrate 20, where substrate 20 comprises a plurality of semiconductor structures, for examples sources, drains and wells. Moreover, cell gates are formed in cell region of DRAM and periphery circuit gates are formed in periphery circuit region of DRAM. Not only each cell gate comprises a conductive layer 22, a polycide layer 23 and a passivation layer 24 in sequence. In addition, each periphery circuit gate comprises a conductive layer 25, a polycide layer 26 and a passivation layer 27 in sequence. No matter how, materials of cell gates are independent on materials of periphery circuit gates. In addition, both conductive layer 22 and conductive layer 25 comprise polysilicon layer and doped polysilicon layer, both polycide layer 23 and polycide layer 26 comprise $WSi_x$ layer and $TiSi_2$ layer and both passivation layer 24 and passivation layer 27 comprise $Si_3N_4$ layer and phosphosilicate glass layer.

Second, a first dielectric layer 21 is formed over substrate and covers cell gates and periphery circuit gates, where first dielectric layer 21 is used to behave as an etching end layer and material of first dielectric layer comprises oxide. Then a second dielectric layer 28 is formed over first dielectric layer 21, where depth of second dielectric layer 28 is slight smaller than depth of passivation layer 27 of gates. Moreover, material of second dielectric layer is equal to material of passivation layer 27.

Third, a plurality of spacers are formed in sidewalls of periphery circuit gates. In comparison, cell gates are still covered by second dielectric layer 28 and there is no spacer.

Figure 2B:
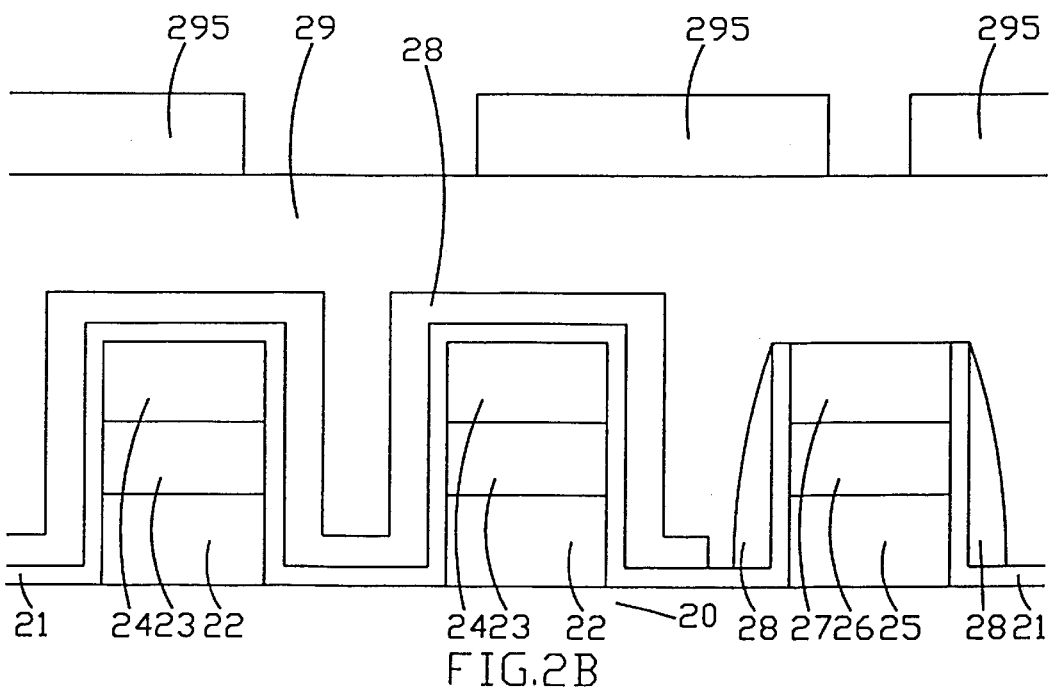

Afterwards, as shown in FIG. 2B, third dielectric layer 29 is formed over the substrate and covers these cell gates and these periphery circuit gates, where material of third dielectric layer comprises oxide. Moreover, the depth of third dielectric layer 29 is higher than these heights of these cell gates and these heights of these periphery circuit gates.

Fourth, a photoresist layer 295 is formed over third dielectric layer 29 to define these vias regions in both the cell region and the periphery circuit region of DRAM. Where vias in the cell region locate between these cell gates and land on the substrate, and vias in the periphery circuit region locate on these periphery circuit gates and land on the polycide layer of periphery circuit gates. Of course, the surface of third dielectric layer 29 can be planarized by conventional planarization process to enhance precision of photolithography and etching.

Figure 2C:
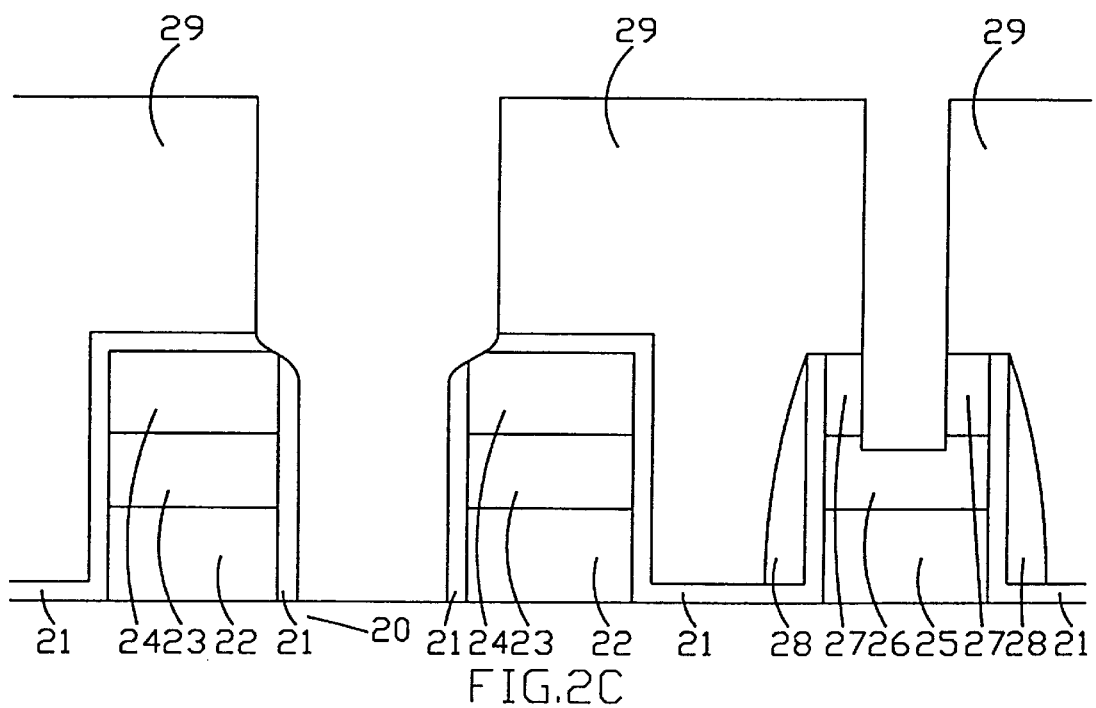

Fifth, as shown in FIG. 2C, etching parts of third dielectric layer 29, where these etched parts are uncovered by photoresist layer 295. Afterwards, both part of first dielectric layer 21 and part of passivation layer 27 of the periphery circuit gates are etched, where etching part of first dielectric layer 21 and part of passivation layer 27 are uncovered by photoresist layer.

Finally, removing excess photoresist layer 295 and then vias are formed.

It is important that because depth of second dielectric layer 28 is slight lesser than depth of passivation layer 27 of periphery circuit gates. As vias in periphery circuit region land on polycide layer 26, vias in cell region has already land on substrate 20. Moreover, difference between depth is adjust to let part of first dielectric layer 21 that under vias of cell region also is etched before vias in periphery circuit region land on polycide layer 26.

Obviously, essential point of invention is vias of cell region land on substrate 20 and vias of periphery region land on passivation layer 27 at the same time, and each vias contact to a conductor. No matter how, vias of periphery region can sink into polycide layer 26 for vias is used to fill conductor and conduct current from polycide layer 26 to other elements.

According another embodiment, a method for forming polysilicon vias land on different areas for high density dynamic random access memory is provided, mechanism of the embodiment is similar to previous embodiment and provided method comprise following steps:

First, a doped polysilicon layer, a WSi layer and a first SiN layer are formed over a substrate in sequence. Where substrate comprises a plurality of semiconductor structures and these semiconductor structures comprises shallow junctions and wells. Subsequently, conventional photolithography process and etching process are used to form a plurality of cell gates in cell region of high density DRAM and a plurality of periphery circuit gates in periphery circuit region of high density DRAM.

Second, a first oxide layer is formed over substrate and covers cell gates and periphery circuit gates. Then a second SiN layer is formed over first oxide layer, wherein depth of second SiN layer is slight smaller than depth of first SiN layer of periphery circuit gates.

Third, conventional spacer process is used to form a plurality of SiN spacers in periphery circuit gates, where cell gates are still covered by first oxide layer.

Fourth, a second oxide layer is formed over substrate and covers cell gates and periphery circuit gates, wherein depth of said second oxide layer is higher than heights of said gates.

Afterwards, conventional photolithography process is used to define vias regions in both cell region and periphery circuit region by forming a photolithography over second oxide layer. Where vias in cell region land on said substrate and locate between said cell gates, and vias in periphery circuit region land on WSi layer of periphery circuit gates and locate on periphery circuit gates.

Fifth, part of said second oxide layer and part of said second SiN layer and part of said first SiN layer of periphery circuit cell are etched in sequence. Where part of second oxide layer, part of second SiN layer and part of first SiN layer are uncovered by photoresist layer.

Finally, removing excess said photoresist layer and then vias are formed and land on both said cell regions and said periphery circuit region.

In addition, as discussion of previous embodiment, difference of depth between said second SiN layer and said first SiN layer is adjusted to let as vias in periphery circuit region land to WSi layer of periphery circuit gates by etching process, vias in cell region has lands on substrate.

Although specific embodiments have been illustrated and described, it will be obvious to those skilled in the art that various modifications may be made without departing from what is intended to be limited solely by the appended claims.

What is claimed is:

1. A method for forming different area vias of dynamic random access memory, said method comprise:

forming a plurality of cell gates in a cell region and a plurality of periphery circuit gates in a periphery circuit region, each said gates is formed on a substrate and comprises a conductive layer, a polycide layer and a passivation layer in sequence;

forming a first dielectric layer over said substrate and covering said cell gates and said periphery circuit gates;

forming a second dielectric layer over said first dielectric layer;

etching back part said second dielectric layer and forming spacers in sidewalls of said periphery circuit gates;

forming a third dielectric layer over said substrate and covering said cell gates and said periphery circuit gates;

forming a photoresist layer on said third dielectric layer, said photoresist layer defines vias regions in said cell region and said periphery circuit region;

etching part of said third dielectric layer, said part of said third dielectric layer is uncovered by said photoresist layer;

etching part of said first dielectric layer and part of said passivation layer of periphery circuit gates, where said part of said third dielectric layer and part of said passivation layer are uncovered by said photoresist layer; and removing excess said photoresist layer and then said vias are formed.

2. The method according to claim 1, wherein said substrate comprises a plurality of semiconductor structures and said semiconductor structure comprises sources drains and wells.

3. The method according to claim 1, wherein said conductive layer comprises polysilicon layer and doped polysilicon layer.

4. The method according to claim 1, wherein said polycide layer comprises $WSi_x$ layer and $TiSi_2$ layer.

5. The method according to claim 1, where material of said passivation layer comprises $Si_3N_4$ and phosphosilicate glass.

6. The method according to claim 1, wherein said first dielectric layer comprises oxide layer.

7. The method according to claim 1, wherein said first dielectric layer is used to formed an etching end layer.

8. The method according to claim 1, wherein material of said second dielectric layer is equal to material of said passivation layer.

9. The method according to claim 1, wherein said third dielectric layer comprises oxide layer.

10. The method according to claim 1, wherein depth of said third dielectric layer is higher than heights of said cell gates and height of said periphery circuit gates.

11. The method according to claim 1, furthermore comprising planarization process of surface of said third dielectric layer.

12. The method according to claim 1, wherein depth of said second dielectric layer is slight smaller than depth of said passivation layer of periphery circuit gates.

13. The method according to claim 12, wherein said difference of depth between said second dielectric layer and said passivation layer is adjusted so that when vias in said periphery circuit region land on said polycide layer of said periphery circuit gates, vias in said cell region has already landed on said substrate.

14. The method according to claim 1, wherein said vias in said cell region locate between said cell gates and land on said substrate, and said vias in said periphery circuit region locate on said periphery circuit gates and land on said polycide layer of said periphery circuit gates.

15. A method for forming poly vias land on different areas for high density dynamic random access memory, said method comprise:

forming a doped polysilicon layer over a substrate;

forming a WSi layer over said doped polysilicon layer;

forming a first SiN layer over said WSi layer;

forming a plurality of cell gates in a cell region and a plurality of periphery circuit gates in a periphery circuit region by conventional photolithography process and etching process;

forming a first oxide layer over said substrate and covering said cell gates and said periphery circuit gates;

forming a second SiN layer over said first oxide layer;

etching back part of said second SiN layer and forming a plurality of SiN spacers in said periphery circuit gates;

forming a second oxide layer over said substrate and covering said cell gates and said periphery circuit gates;

forming a photoresist layer on said second oxide layer, said photoresist layer defines vias regions in said cell region and said periphery circuit region;

etching part of said second oxide layer, said part of said second oxide layer is uncovered by said photoresist layer;

etching part of said second SiN layer and part of said first SiN layer of periphery circuit cell, where said part of said second SiN layer and part of said first SiN layer are uncovered by said photoresist layer;

removing excess said photoresist layer and then said vias are formed, where said vias land on both said cell regions and said periphery circuit region; and filling polysilicon in said vias and then said polysilicon vias are formed.

16. The method according to claim 15, wherein said substrate comprises a plurality of semiconductor structures and said semiconductor structure comprises shallow junctions and wells.

17. The method according to claim 15, wherein depth of said second oxide layer is higher than heights of said gates.

18. The method according to claim 15, wherein depth of said second SiN layer is slight smaller than depth of said first SiN layer of periphery circuit gates.

19. The method according to claim 18, wherein said difference of depth between said second SiN layer and said first SiN layer is adjusted such that when said vias in said periphery circuit region land on said WSi layer of said periphery circuit gates, said vias in said cell region has already lands on said substrate.

20. The method according to claim 15, wherein said vias in said cell region land on said substrate and locate between said cell gates, and said vias in said periphery circuit region land on said WSi layer of said periphery circuit gates and locate on said periphery circuit gates.

* * * * *